United States Patent
Creemer et al.

(10) Patent No.: US 9,548,184 B2
(45) Date of Patent: Jan. 17, 2017

(54) MICROREACTOR FOR A TRANSMISSION ELECTRON MICROSCOPE AND HEATING ELEMENT AND METHOD OF MANUFACTURE THEREOF

(75) Inventors: Jan Fredrik Creemer, Den Haag (NL); Hendrik Willem Zandbergen, Katwijk ZH (NL); Pasqualina Maria Sarro, Den Haag (NL)

(73) Assignees: Technische Universiteit Delft, Delft (NL); Stichting voor de Technische Wetenschappen, Utrecht (NL)

( * ) Notice: Subject to any disclaimer, the term of this patent is extended or adjusted under 35 U.S.C. 154(b) by 1724 days.

(21) Appl. No.: 11/575,153

(22) PCT Filed: Sep. 12, 2005

(86) PCT No.: PCT/NL2005/000662
§ 371 (c)(1),
(2), (4) Date: Nov. 9, 2007

(87) PCT Pub. No.: WO2006/031104
PCT Pub. Date: Mar. 23, 2006

(65) Prior Publication Data
US 2008/0179518 A1    Jul. 31, 2008

(30) Foreign Application Priority Data
Sep. 13, 2004  (NL) ...................... 1027025

(51) Int. Cl.
*H01J 37/26* (2006.01)
*H01J 37/20* (2006.01)

(52) U.S. Cl.
CPC .............. *H01J 37/26* (2013.01); *H01J 37/20* (2013.01); *H01J 2237/2002* (2013.01); *H01J 2237/206* (2013.01)

(58) Field of Classification Search
CPC ...... H01J 37/20; H01J 37/26; H01J 2237/206; H01J 2237/2002; G01N 23/00
(Continued)

(56) References Cited

U.S. PATENT DOCUMENTS 2,266,082 A * 12/1941 Ruska ........................... 250/311
5,091,651 A *  2/1992 Hokke ........................ 250/443.1
(Continued)

FOREIGN PATENT DOCUMENTS

| JP | 47-016358 | 10/1972 |
| JP | 49-048260 | 12/1974 |

(Continued)

OTHER PUBLICATIONS

Communication Pursuant to Article 94(3), dated Sep. 17, 2009, from EP 057873282.

(Continued)

*Primary Examiner* — Lyle Alexander
*Assistant Examiner* — Robert Eom
(74) *Attorney, Agent, or Firm* — Swanson & Bratschun, L.L.C.

(57) ABSTRACT

A microreactor for use in a microscope, comprising a first and second cove layer (13), which cover layers are both at least partly transparent to an electron beam (14) of an electron microscope, and extend next to each other at a mutual distance from each other and between which a chamber (15) is enclosed, wherein an inlet (4) and an outlet (5) are provided for feeding fluid through the chamber and wherein heating means (8) are provided for heating the chamber and/or elements present therein.

12 Claims, 7 Drawing Sheets

(58) Field of Classification Search
USPC ....... 422/199; 250/306, 311, 440.11, 442.11, 250/443.1
See application file for complete search history.

(56) References Cited

U.S. PATENT DOCUMENTS

| | | | | |
|---|---|---|---|---|
| 5,406,087 | A * | 4/1995 | Fujiyoshi et al. | 250/440.11 |
| 5,821,544 | A * | 10/1998 | Augustus | H01J 37/20 |
| | | | | 250/440.11 |
| 6,495,838 | B1 * | 12/2002 | Yaguchi et al. | 250/443.1 |
| 6,537,506 | B1 * | 3/2003 | Schwalbe et al. | 422/130 |
| 2003/0150806 | A1 * | 8/2003 | Hobbs et al. | 210/635 |
| 2004/0043479 | A1 * | 3/2004 | Briscoe et al. | 435/288.5 |

FOREIGN PATENT DOCUMENTS

| | | |
|---|---|---|
| JP | 57-95762 | 6/1982 |
| JP | 2002-254653 | 9/2002 |
| JP | 2003-187735 | 7/2003 |
| WO | WO 96/20495 | 7/1996 |
| WO | WO 02/45125 | 6/2002 |

OTHER PUBLICATIONS

Williamson, et al. (2003) Nature Materials 2:532-536 + Supp, "Dynamic microscopy of nanoscale cluster growth at the solid—liquid interface".

* cited by examiner

MICROREACTOR FOR A TRANSMISSION ELECTRON MICROSCOPE AND HEATING ELEMENT AND METHOD OF MANUFACTURE THEREOF

CROSS REFERENCE TO RELATED APPLICATIONS

This application claims the benefit of PCT/NL2005/000662, filed on Sep. 12, 2005, which claims priority to NL1027025, filed on Sep. 13, 2004.

BACKGROUND

The invention relates to a microreactor for an electron microscope.

Electron microscopes are used for studying specimens with a high resolution, for instance a resolution higher than 0.2 nm, more in particular higher than 0.12 nm. To this end, a specimen holder with a specimen therein is placed in an electron beam of an electron microscope, while an image generated by the beam is displayed on, for instance, a fluorescence screen or is captured with the aid of a camera. Studying these specimens is usually done in a vacuum and at room temperature.

U.S. Pat. No. 5,406,087 describes a specimen holder for an electron microscope where a specimen holder is formed by two thin plastic films, provided with a graphite coating for obtaining electrical conduction. The films are supported on a grid of metal wires for support and are sealed with their fringes against each other with the aid of O-rings. A specimen can be enclosed therein together with water, after which the specimen holder can be placed in an electron microscope with the aid of the specimen holder.

This known specimen holder has the disadvantage that the chamber of the specimen holder needs to be filled with a liquid and the specimen in order to keep the two films at a distance. In addition, no pressure can be applied in the chamber without deformations of the specimen and/or the chamber occurring, which severely disturb the images of the electron microscope. A further drawback of this known specimen holder is that temperature control of the specimen and/or the chamber is not well possible therein.

A further drawback of this specimen holder is that the distance between the walls of the chamber, measured parallel to the electron beam, is relatively large, so that further disturbance of the images occurs. In addition, the films are so thick that HREM (High Resolution Electron Microscopies) is not possible with them. In addition, the liquid causes undesired diffusions of the electron beam, which renders the use of HREM useless.

U.S. Pat. No. 5,406,087 describes as the state of the art a specimen holder in which a specimen chamber is provided with relatively stiff walls. These are kept at a relatively large distance, while magnetic lenses are provided for focusing the electron beam directly above and below the specimen chamber. This specimen chamber also has the drawback that insufficiently sharp images can be obtained therewith, particularly with small specimens.

These known specimen holders all have a limited field of application, with which, as the case may be, insufficiently sharp images can be obtained. In addition, the temperature cannot be controlled therein.

There is a need for the possibility to study specimens in a fluid environment, while preferably the ambient temperature of the specimen can be controlled.

SUMMARY OF THE INVENTION

The invention contemplates providing a microreactor with which at least a part of the problems from the prior art are obviated.

The invention contemplates providing such a microreactor which has a simple construction and is easy to use.

The invention further contemplates providing a microreactor in which pressure and temperature can be controlled and in which relatively small specimens can be viewed, while relatively sharp images are obtained, at least a relatively high resolution.

The invention further contemplates providing a microreactor in which specimens can be viewed in different conditions, including in a gas or liquid environment.

The invention further contemplates providing a method for the formation of a microreactor and a heating element for use therein.

At least a number of these and further objects are achieved according to the invention with a microreactor according to the invention. A microreactor according to the invention is characterized by the measures according, to claim 1.

A microreactor according to the present invention comprises two cover layers, at least partly transparent to an electron beam of an electron microscope, which cover layers are kept at a relatively small mutual distance from each other. Between the cover layers, a specimen chamber is enclosed, provided with an inlet and an outlet, so that a fluid and/or a specimen can be fed into and/or through the chamber. The microreactor is further provided with heating means for heating fluid present in the chamber and/or elements present therein such as a specimen.

In this description, transparent is at least understood to mean such a layer that, with an electron beam of a transmission electron microscope, a resolution can be achieved which is higher than about 0.2 nm, more in particular higher than 0.12 nm.

Because the heating means are provided for the microreactor, a specimen present therein can be brought to and/or maintained at a desired temperature, for instance indirectly by heating a fluid, so that, for instance, specific reactions can be primed, can be maintained or, conversely, can be prevented in the microreactor. In addition, the specimen can thus be brought into and/or maintained in a desired condition for obtaining an optimal image. Here, the inlet and outlet allow a fluid to flow into and/or through the chamber, so that the pressure can also be controlled therein, relative to the environment of the chamber.

In a microreactor according to the present invention, the mutual distance between the cover layers is preferably relatively small, for instance on average less than 50 micrometers, more in particular less than 20 micrometers and preferably less than 10 micrometers. The exposed surface of the chamber, measured at right angles to the direction of the electron beam, is preferably relatively small. This surface is, for instance, less than 20 $mm^2$, more in particular less than 10 micrometers. Thus, a chamber is obtained with a relatively small volume, so that the temperature control is relatively simply and quickly possible, just like changes in the pressure.

Preferably, the cover layers are supported by a frame-shaped supporting element, such that, inside each supporting element, a recess is provided which is covered by an exposed part of the cover layer. This exposed part preferably has a surface which is relatively small, for instance less than 5 $mm^2$, more in particular between 0 and 4 $mm^2$, for instance approximately 1 $mm^2$. Each cover layer is preferably virtually flat and is relatively stiff, such that virtually no deformations occur therein during normal use.

In a particularly advantageous embodiment, at least one of the cover 1.5 layers, preferably each of the cover layers, is provided with one or more windows, transparent to the electron beam, in particular more transparent than the further cover layer. To this end, for instance, the cover layer can have been thinned locally, thereby forming a recess whose bottom is formed by the window, transparent to the electron beam. Here, each window has a surface which is particularly small compared with the total surface of the chamber, for instance a few square micrometers. Specimens on a micrometer or even nanometer scale can be provided on such a window so that a still better image can be obtained.

In a specimen chamber according to the present invention, the heating means are preferably provided on, in particular in at least one of the cover layers, in the form of one or more heating elements which are distributed over virtually the whole surface of the chamber, at least an exposed part thereof as described hereinabove, so that a uniform heat distribution is obtained over the surface and consequently in the chamber. By designing the or each heating element in separate heating parts with parts of the cover layer between them, the image is prevented from being covered by the heating element. This is because the or each specimen can then be observed at least between the heating elements.

In a particularly advantageous embodiment, a heating element is used in the form of a heater coil. Preferably, a heating element according to the present invention is manufactured from titanium nitrate, for instance in the form of strips and/or plates with a particularly small thickness, for instance less than 500 nanometers, more in particular for instance 300 nanometers or less. Thus, the heating element can particularly simply lo be included in a cover layer or be formed therein, without the chamber being undesirably influenced with regard to shape.

A microreactor according to the present invention is preferably manufactured with a method according to the present invention, in which use is made of chip technology, in particular lithography. Thereby, chips can be built up from different layers, while, for instance, a window can be manufactured from silicon, covered on both sides by silicon oxide, on which one or more cover layers of silicon nitrate have been provided. In a known manner, a part of the cover layers, the intermediate layer and the support can be removed, in particular etched, for the formation of a recess up to the cover layer to be preserved, so that a good support of the cover layer is obtained, an accurate dimensioning can be maintained on a particularly small scale and, in addition, the desired properties can be obtained. The materials mentioned are only mentioned as examples.

Prior to the application of an outer finishing layer (the finishing layer of the cover layer which faces the chamber), the heating means can be provided, for instance by a known sputtering technique, vapor deposition technique, etching technique or any other suitable manner. At the same time, connecting electrodes can be provided, as well as, for instance, the inlet and outlet. Spacer means may be provided on the cover layers, for instance manufactured from silicon oxide, so that side walls of the chamber are simply obtained.

Two chips thus formed can simply be provided on top of each other, while the cover layers are kept at a distance from each other by the spacers.

The invention further relates to a specimen holder, provided with a microreactor according to the present invention, which specimen holder is suitable for placing in a specimen chamber of an electron microscope, while, through the specimen holder, a supply and discharge channel extend which are or can be brought in connection with the inlet and outlet of the microreactor, respectively, so that, in situ, through the specimen holder, a fluid can be fed into or through the specimen chamber.

BRIEF DESCRIPTION OF THE SEVERAL VIEWS OF THE DRAWINGS

By way of illustration of the present invention, exemplary embodiments of a microreactor, method and specimen holder according to the present invention, and of a heating element therefor will be explained in more detail with reference to the drawing, in which.

DETAILED DESCRIPTION

In the following description, same or corresponding parts will be designated by same or corresponding reference numerals. These exemplary embodiments are only shown by way of In this description, a microreactor will be shown and described which is substantially built up from two building parts. These building parts will be referred to as 'chips' since they are substantially manufactured with chip technology. However, these building parts could also be formed in different manners.

Figure 1:
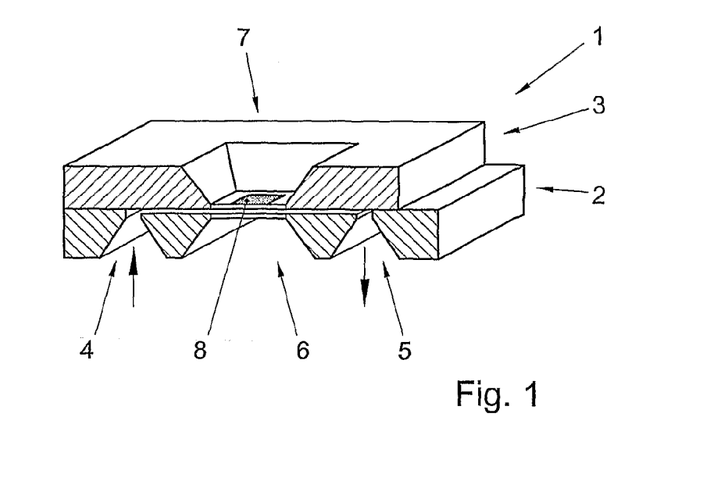
FIG. 1 shows, in cross-sectional perspective view, a microreactor according to the present invention.

FIG. 1 shows, in cross-sectional perspective view, a microreactor 1 according to the invention, comprising a first chip 2 and a second chip 3. In FIG. 1, the first chip 2 is placed on the bottom side and comprises an inlet 4 and an outlet 5, as well as a central recess 6. Opposite the central recess 6, the top chip 3 comprises a similar recess 7. The chips 2, 3 form frame-shaped supporting parts 50 around the recesses 6, 7 and, on the opposite side circumferential annular spacers 9. The spacers 9 are fixed against one another, for instance by gluing, clamping or any other suitable technique. In the recess 6, 7, a heater coil 8 is visible, which will be explained in more detail.

Figure 2:
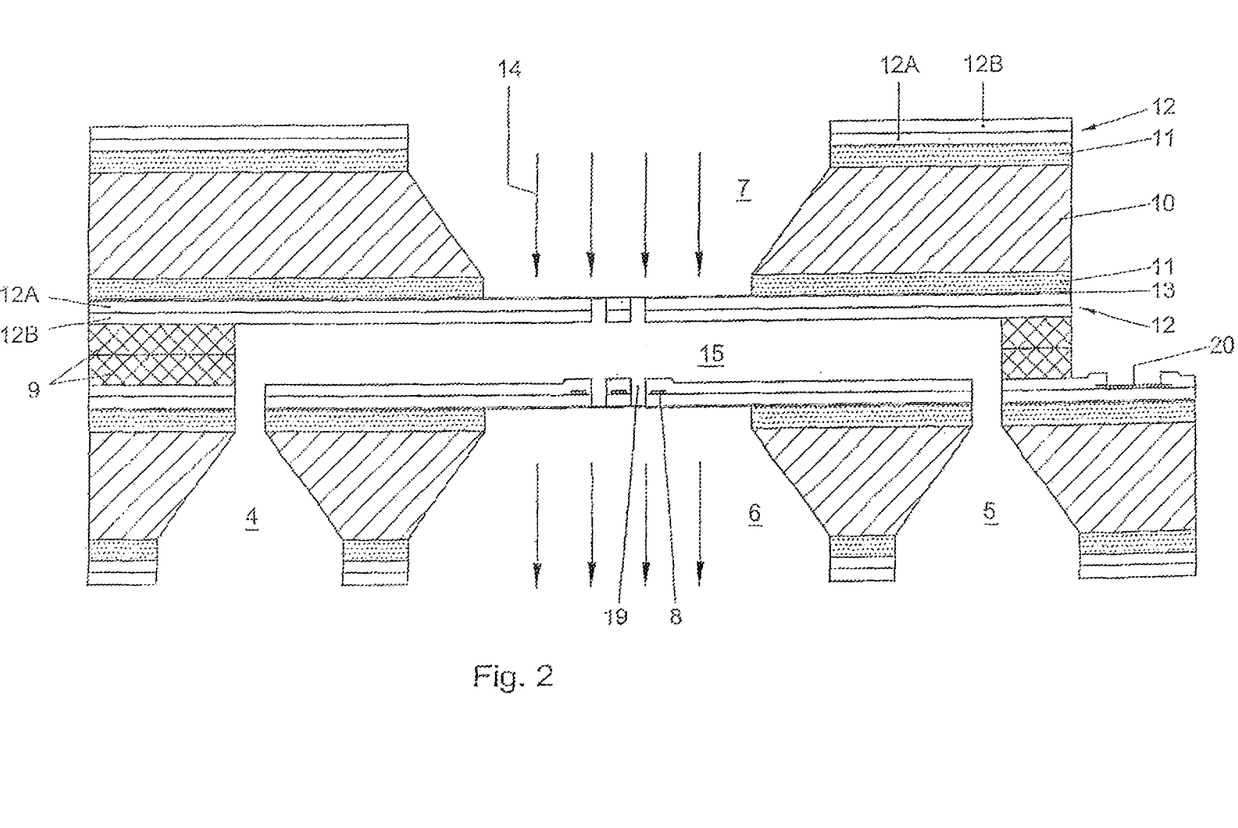
FIG. 2 shows, enlarged and not to scale, a cross-sectional side elevational view of a microreactor according to the present invention.

FIG. 2 shows, in a cross-sectional side elevational view, in enlargement, a microreactor according to FIG. 1, where the cross section is not shown to scale. For reasons of clarity, some dimensions are shown relatively enlarged with respect to other dimensions.

Clearly visible in FIG. 2 are the bottom chip 2 and the top chip 3, kept at a mutual distance by spacers 9, for instance formed by a plate-shaped part with a central opening.

In the exemplary embodiment shown, each chip is built up from a series of layers, which will be discussed herein by way of illustration and should not be taken as being limitative. In the exemplary embodiment shown, the structure of the two chips 2, 3 is substantially identical. The chips 2, 3 comprise a central first layer 10, manufactured from silicon. On both sides thereof, there is a second layer 11, for instance manufactured from silicon oxide (wet $SiO_2$). On the second layer 11, on both sides, a third layer 12 is provided, built up from two substantially identical layers of silicon nitrate (lpcvd SiN), designated as layers 12a and 12b. Between the second layer 11 and third layer 12, on the facing sides of the first and second chip 2, 3, an intermediate layer 13 has been provided, for instance manufactured from silicon nitrate.

By way of illustration, some dimensions of the thicknesses of the layers are shown, which should not be taken as being limitative in any way. The first layer 10 is, for instance, about 525 μm, each second layer about 0.75 μm. The two third layers 12a, 12b are each 5 μm thick, while the intermediate layer 13 is about 10 nanometers thick. The two spacers 9 each have a thickness of, for instance, about 1 μm.

With the aid of known chip technology, in particular lithography, the recesses 6, 7 have been provided in the first chip 2 and the second chip 3, respectively, from opposite sides of the chips 2, 3 in FIG. 2 up to the respective intermediate layers 13. In the exemplary embodiment shown, the recesses 6, 7 have inclined walls in the first layer 10, such that the ends remote from each other of the recesses 6, 7 are wider than on the sides facing each other.

The third layers 12 of the two chips 2, 3 form cover layers manufactured from silicon nitrate together with the intermediate layers 13. These cover layers are, at least in the recesses 6, 7, slightly transparent to an electron beam 14 of an electron microscope, as schematically shown by the arrows in FIG. 2. In the first chip 2, on a first side of the recess 6, the inlet 4 is provided, while, on the opposite side of the recess 6, the outlet 5 is provided. Just like the recess 6, the inlet 4 and the outlet 5 have been manufactured with chip technology, in particular lithography, and extend through the cover layer 12. The spacers 9 and cover layers 12 enclose a reaction chamber, into which the inlet 4 and the outlet 5 open. A fluid, such as a gas or a liquid, can thus operatively flow from the inlet 4 through the reaction chamber 15 to the outlet 5, so that flows and pressures in the reaction chamber can simply be controlled and/or measured.

In the cover layer 12 of the first chip 2, located centrally with respect to the recess 6, a heating means 8 in the form of a coil has been provided, between the layers 12a and 12b. The first chip 2 is schematically shown in top plan view in FIG. 3, while embodiments of such a heating element are shown in enlargement in FIG. 4 and FIG. 10. In the embodiment shown, the heater coil 8 is built up from a thin wire of titanium nitride, connected to two first electrodes 15 and two second electrodes 16. The heater coil 8 consists of a series of straight heating parts 17, all offset relative to each other at approximately straight angles, so that a double-wound coil has been created. In use, an electrical voltage is applied on this, so that, as a result of resistance, an accurately controllable heating is obtained. The titanium nitrate can be provided by reactive sputtering, for instance in a Trikon Sigma DC microwave reactor.

Between the heating parts 17 extending parallel to one another, recesses 19 have been provided for the formation of windows, in the embodiment shown with an approximately circular cross section. As appears from FIG. 2, these recesses are designed such that they extend through the cover layer 12 up to the intermediate layer 13. This intermediate layer 13 is such that an electron ray can easily pass this layer without an adverse effect on the imaging.

Figure 10:
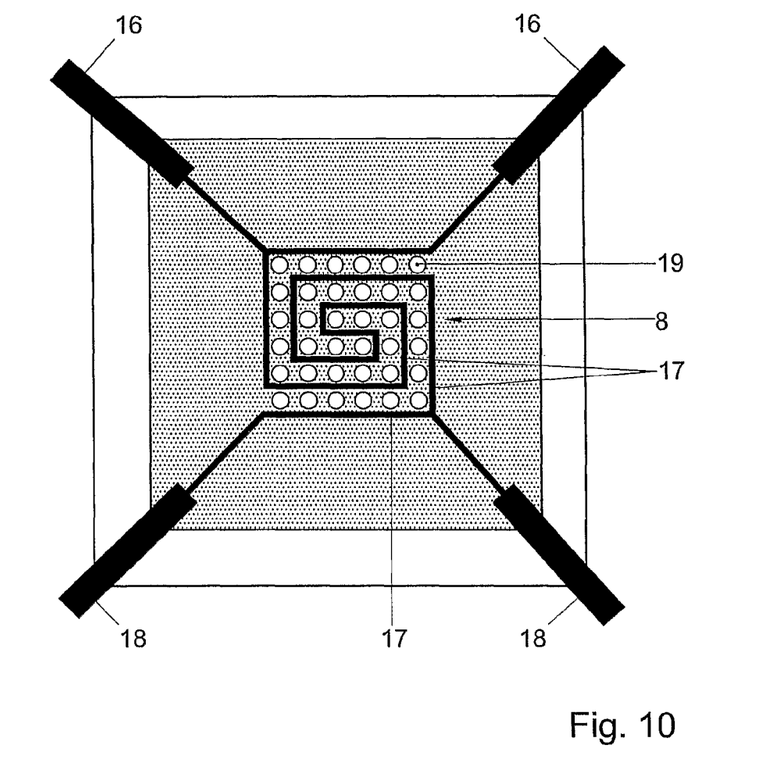
FIG. 10 shows, in top plan view, a heating element according to the invention.

By way of illustration, a number of dimensions are given of the heating element and the windows, which should not be taken as being limitative in any way. For instance, the heating parts 17 may have a thickness of about 20 nanometers and a width of about 18 μm. Between two heating parts 17 extending parallel to each other, a strip may be provided with a width of about 12 μm, in which two rows of windows 19 may be provided next to each other, each window with a diameter of, for instance, about 2 μm (FIG. 4) or, in each case, one row of windows 19 with a slightly larger diameter (FIG. 10). In use, a specimen can extend over the recess 19 or, in use, with particularly small specimens, elements can extend in the recesses 19, resting on the intermediate layer 13. Preferably, each cover layer 12 is provided with such recesses 19, in particular, in each case, pairs of recesses 19 directly opposite each other.

Figure 3:
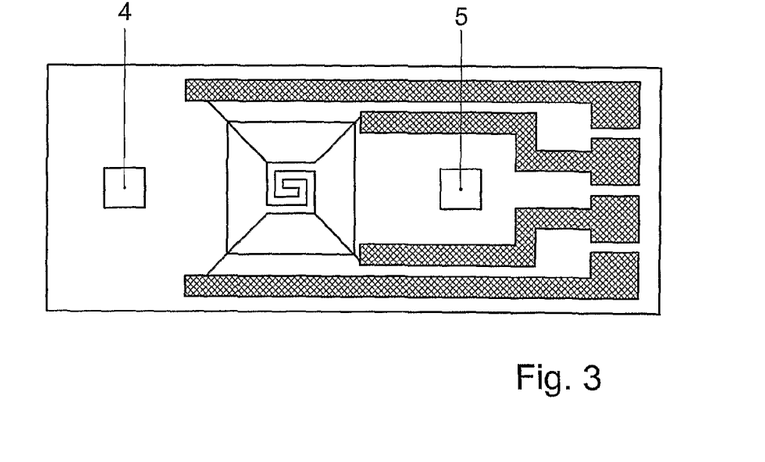
FIG. 3 schematically shows, in top plan view, a chip for use for the formation of a microreactor according to the present invention.
Figure 4:
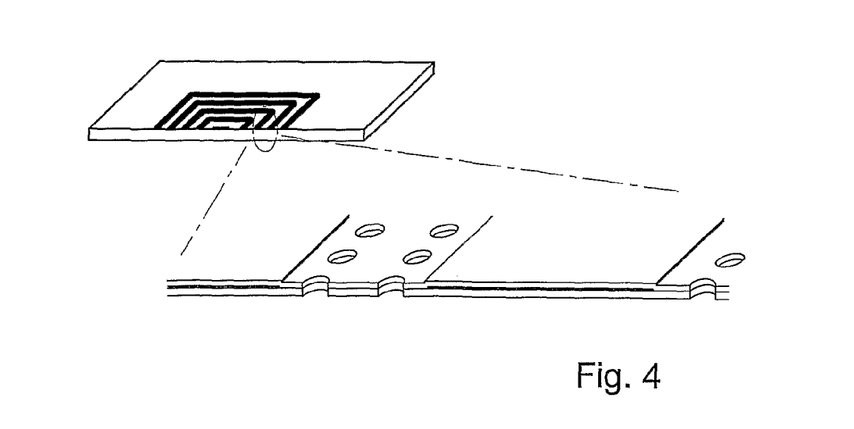
FIG. 4 schematically shows, in further enlargement, a part of a cover layer of a chip according to the present invention.

As is clearly visible in FIG. 3, the electrodes 15, 16 extend to near a side of the bottom, first chip 2 where, as shown in FIG. 2, electrical contacts 20 are exposed in the respective surface of the chip 2, so that electrical contact can be made. Because the heater coil 8 is covered on both sides by one of the layers 12a, 12b, the heating parts 17 are protected well and a still more even heat distribution is obtained in the chamber 15.

Figure 11:
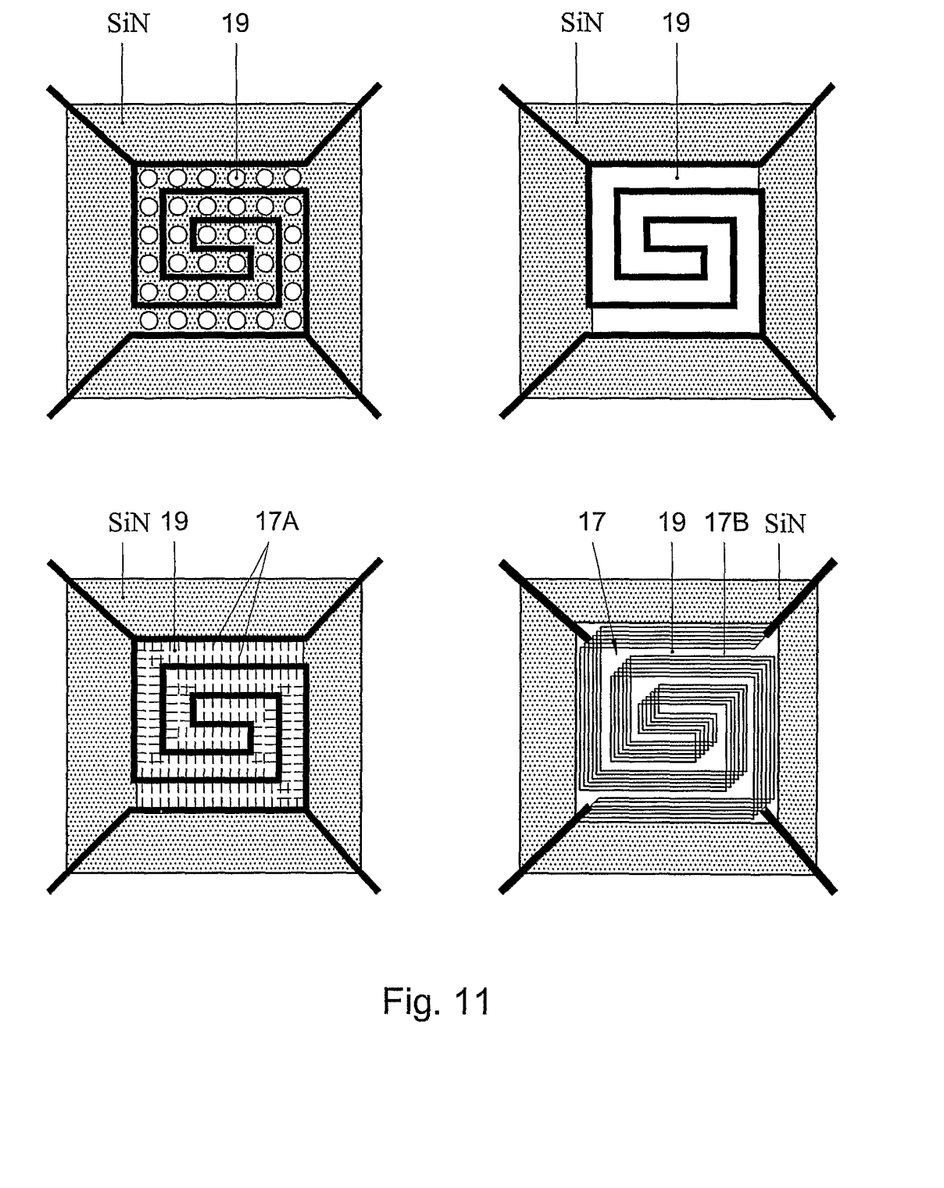
FIG. 11 shows four alternative embodiments of a heating element according to the present invention.

FIG. 11 schematically shows four embodiments of heating means 8, as discussed hereinabove. From top left and clockwise, on a thin membrane, for instance SiN, a coil is supported with openings in rows, a coil with complete openings 19 between the parts 17, preferably without bottom, a coil with parts 17 built up from parallel, very thin bands 17B, supported above an opening 19, a coil with parts 17 with openings 19 between them, while thin projections 17A extend in the openings connected with the parts 17.

Figure 5:
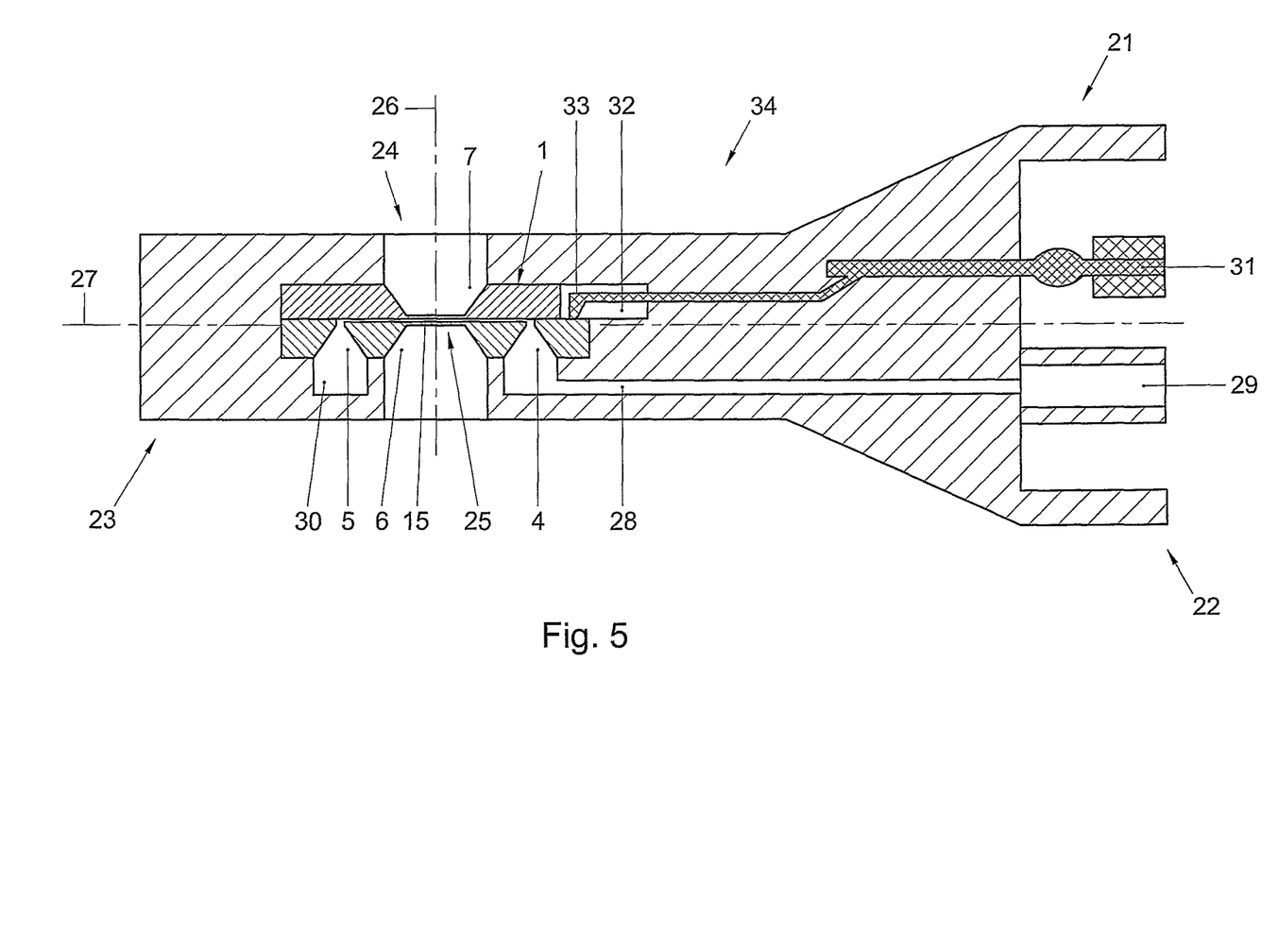
FIG. 5 schematically shows a specimen holder according to the present invention.

FIG. 5 schematically shows a longitudinal cross section of a specimen holder 21 according to the invention. Insofar as not discussed herein in more detail, a specimen holder 21 according to the invention is designed as a known specimen holder, for instance a specimen holder as described in PCT/NL95/00444, in particular with regard to means for suspension in an electron microscope and for control of the specimen holder.

Such a specimen holder 21 has a first end 22 which operatively extends outside the electron microscope, for control of the specimen holder, and an opposite second end or tip 23 which operatively extends in a vacuum space of the electron microscope (not shown). In the tip 23, a specimen can be received for placement in an electron beam. In the specimen holder 21 according to the invention, as shown in FIG. 5, a microreactor 1 according to the invention, as shown in FIGS. 1 and 2, has been received, such that the recesses 6, 7 extend in a passage 24 in the tip 23, so that the parts 25 of the cover layers 12 which extend in the respective recesses 6, 7 are visible therein. FIG. 5 shows the optical axis 26 as an interrupted line indicating the electron beam 14.

Through the specimen holder 21, approximately parallel to the longitudinal axis 27 thereof, a gas supply channel 28 extends, which connects a gas supply 29 with the inlet 4 on a first side of the opening 24. On the opposite side thereof, the outlet 5 of the chamber 15 is connected with a gas discharge channel 30, of which only a small part is shown below the outlet 5. This gas outlet channel extends from the tip 23, approximately parallel to the gas supply channel 28 into the first end 22, for connection to a gas discharge. In addition, from the first end 22, an electric line 31 extends into a chamber 32 near the microreactor 1, in which chamber 32 the electric line 31 is connected with the four contacts 20 on the first chip 2 via a contact 33.

A specimen holder according to FIG. 5 has the advantage that all supply and discharge of electrical voltage and gas or another fluid to and from the reactor 1 can take place through the shaft 34 of the specimen holder 21 and can consequently be controlled from the outside of the electron microscope. In addition, the shaft 34 can be rotated about the longitudinal axis 27, without the operation of the specimen holder being disturbed thereby. This means that a specimen in the chamber 15 can be rotated about the longitudinal axis 27, relative to the optical axis 26.

It will be clear that, via the inlet channel 28 and the discharge channel 30, a fluid flow, such as a gas flow or a liquid flow through the chamber 15 can be obtained but that the pressure in the chamber 15 can also be controlled therewith without a flow being generated therein. In addition, with the aid of the heating means 8, the temperature in the chamber can accurately be controlled and monitored. Also, the heater coil 8 can be used for detecting changes in the temperature in the chamber 15, for instance as a result of reactions occurring in this chamber 15.

Figure 8:
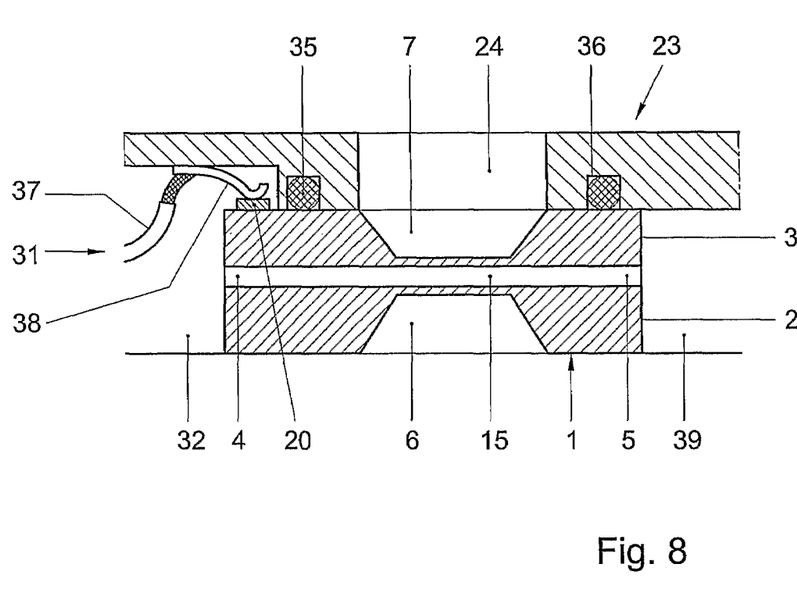
FIG. 8 schematically shows, in cross-sectional side elevational view, a part of a tip of a specimen holder according to the invention with a microreactor according to the invention therein.

FIG. 8 schematically shows a part of the tip 23 of a specimen holder 21, in which same parts have same reference numerals. By way of simplification, in FIGS. 5-9, the heating means 8 and the windows 19 are not always shown.

As shown in FIG. 8, with respect to the shaft 34, the microreactor 1 is gastightly locked by a gasket 35 provided between them, in particular an O-ring. FIG. 8 only shows a gasket 35 on the top side, against the second chip 3, but, in the same manner, a seal 35 has been or can have been provided on the bottom side against the first chip 2. The gasket 35 extends in a chamber 36 extending around the opening 24. This ensures that the vacuum in the vacuum chamber of the electron microscope can simply be maintained. FIG. 8 further shows an end of an electric wire 37 of the electric line 31, in the chamber 32, where a resilient element 38 is clearly shown, on the one side connected with the line 37 and on the other side abutting the electrical contact 20 of the microreactor 1. In this embodiment, the inlet 4 is directly connected with the chamber 32 and the outlet 5 with a chamber 39 on the opposite side of the microreactor. In a manner similar to the manner shown in FIG. 5, the chambers 32 and 39 are connected with an inlet channel 28 and an outlet channel 30 (not shown in FIG. 8), respectively, for supply and discharge of a fluid and/or control of the pressure in the chamber 15.

Figures 6, 7:
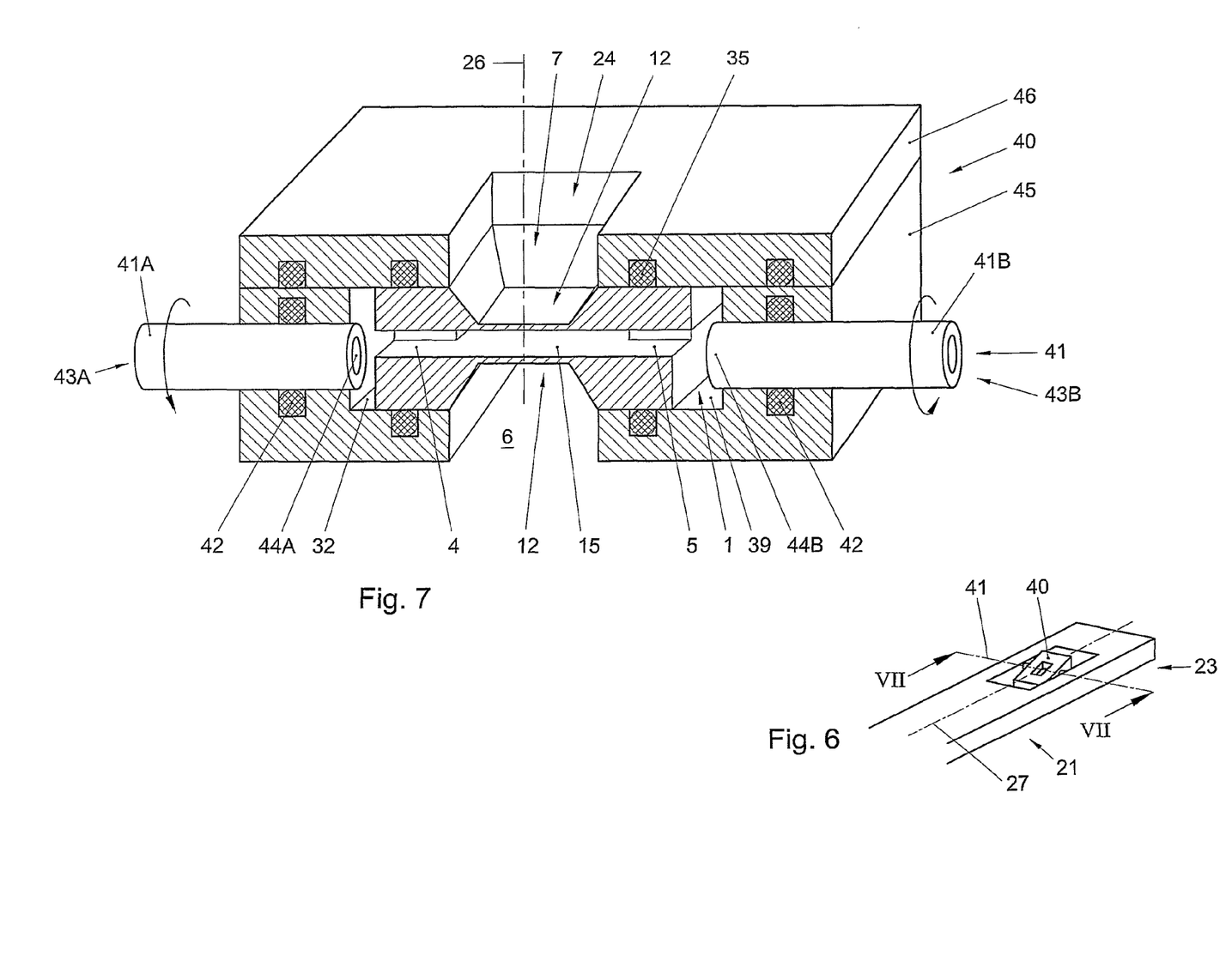
FIG. 6 schematically shows, in perspective view, the tip of a specimen holder according the invention.
FIG. 7 shows, in cross-sectional perspective view, according to the line VII-VII, the tip mentioned in FIG. 6.

FIGS. 6 and 7 show an alternative embodiment of a tip 23 of a specimen holder 21, while FIG. 7 schematically shows a cross section according to the line VII-VII of the tip according to FIG. 6. In this embodiment, the microreactor 1 is received in a pivot body 40 pivotal about an axis 41 extending at right angles to the longitudinal axis 27 of the specimen holder 21. Operating means for the pivot body 40 in such a specimen holder 21 are generally sufficiently well known from practice and will not be discussed in more detail herein.

In the embodiment shown in FIGS. 6 and 7, the microreactor 1 has been received in the pivot body 40 in a manner similar to the manner shown in FIG. 8, while, in FIG. 7, the first chamber 32 extends on the left side and the second chamber 39 on the right side of the microreactor 1. Here, the pivot 41 is built up from a first pivot part 41A and a second pivot part 41B, both designed as a hollow tube provided fixedly in the tip 23. Gaskets 42 seal the pivots 41A, 41B in the pivot body 40. The ends 43A, 43B of the tubes 41A, 41B located on the outside open into a supply channel 28 and discharge channel 30, respectively, through the specimen holder 21, in a manner similar to FIG. 5, while the opposite ends 44A, 44B of the tubes 41A, 41B open into the first chamber 32 and the second chamber 39, respectively. Thus, again, from a first end 22 of a specimen holder 21, a fluid can be supplied and discharged in the chamber 15 and/or the pressure in the chamber 15 can be controlled. With the means known per se, the pivot body 40 can be pivoted about the second ends 44A, 44B of the tubes 41A, 41B about the pivot 41, so that the chamber 15 and consequently a specimen provided therein are pivoted in two directions independently of each other with respect to the optical axis 26.

In the embodiment shown in FIG. 7, the pivot body 40 is built up from a bottom part 45 suspended from the tubes 41A, 41B and a lid 46. In the bottom part 45, a space has been provided in which the microreactor 1 with the gaskets 35 can be placed, after which it can be locked with the aid of the lid 46. This makes replacement of the microreactor simply possible. Such a construction may of course also be used in other embodiments of a specimen holder 21 according to the invention.

Chips 2, 3 may, for instance, be made as follows with the aid of chip technology.

On the first layer 10, on both sides a second layer 11 is provided, which is then covered by the first layer 12A of the third layer 12, while, on at least one side, the intermediate layer 13 is provided between the second layer 11 and the third layer 12. Then, for the manufacture of the first chip 2, the heater coil 8 is provided, on a side of the chip 2, for instance by sputtering and subsequent etching. The titanium nitrate layer can be fixed with the aid of a very thin layer of titanium. Then, the second layer 12B of the respective cover layer 12 is provided. On at least one side, a layer of silicon oxide is provided for the spacer 9.

With methods known per se and not described in detail herein, known from chip technology, in particular lithographic and etching steps, the recesses 4, 5, 6 and 7 are provided in the first and second chip, respectively, while, in addition, a part of the layers of silicon oxide is removed for formation of the window-shaped spacers 9. Subsequently, the recesses 19 are formed for obtaining the windows. In addition, the layer 12B is removed from the contacts 20.

Thereupon, the first chip 2 and the second chip 3 are attached onto each other, thereby forming the chamber 15.

In the foregoing, in each case, a substantially closed chamber 15 has been formed with an inlet 4 and an outlet 5. Of course, in a similar manner, a completely closed chamber 15 can be obtained. Alternatively, the recesses 19 may also be provided such that they form an open connection with the environment, for instance with use with relatively large specimens and/or in situations where a pressure difference between the chamber 15 and the environment is not important or less important.

Figure 9:
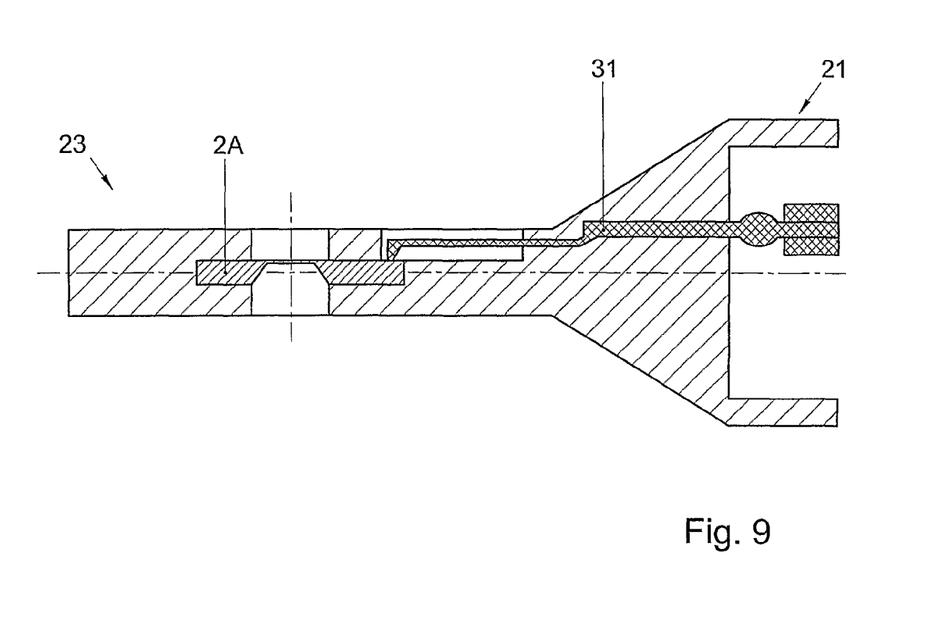
FIG. 9 shows an alternative embodiment of a specimen holder according to the present invention.

Alternatively, a chip according to the invention, in particular a chip with a heating element 8, can be used individually, as a hot plate. Such a chip 2A is schematically shown in FIG. 9, received in the tip 23 of a specimen holder 21, similar to the holder shown in and described with reference to FIG. 5, but without gas supply channel 28 and gas discharge channel 30. The chip 2A is substantially identical to the chip 2 as shown in and described with reference to FIGS. 1 and 2, while, however, the inlet 4 and outlet 5 have been omitted. In particular with such an embodiment, the recesses 19 can extend through the entire thickness of the cover layer 12, in the form of continuous holes. However, these may also be sealed. Electric supply line 31 is again connected to the connecting points 20 of the chip 2A.

In use, a specimen is laid onto the heating element 8, thereby optionally covering a number of the heating parts 17 and the recesses 19 between them. With the heating element, the specimen can be heated in a particularly good and accurate manner, with relatively little supplied energy. By way of illustration, for obtaining a temperature of about 500° C., a power of about 20 mW will be needed instead of about 1 Watt with conventional heating elements for electron microscopes. These values are of course only mentioned by way of example and should not be taken as being limitative in any way. As a result of the relatively low supplied energy, the advantage is achieved that the chip expands relatively little, thereby minimizing drift. This means that undesired image shifts are prevented, which makes obtaining suitable, sufficiently clear images of the specimen considerably simpler.

In a further alternative embodiment, a microreactor 1 according to the invention can be used as a climate cell (conventionally also referred to as environmental cell, wet cell or hydration chamber), in particular for studying biological tissues with an electron microscope. To this end, in the microreactor and/or in the specimen holder 21, an extra chamber is provided, in which heating means are provided. In use, in this extra chamber, for instance chamber 32 or 39 in FIG. 7 or 8, a liquid, in particular water, is provided which is brought to a temperature substantially equal to the temperature in the chamber 15 with the aid of the extra heating means. In use, a specimen in the form of a biological tissue is introduced into the chamber 15, surrounded by a saturated water vapor, in such a manner that condensation is prevented. To this end, the water in the extra chamber is heated to the desired temperature, while, in addition, the pressure in the chamber is controlled, so that the saturated water vapor can always be maintained. Such a cell according to the invention offers the advantage over cells known from the prior art that, as a result of the heating means and/or the inlet and outlet, a considerably better climate control is possible inside the chamber, so that damage of the specimen can be prevented better and, in addition, better images thereof can be obtained. A further advantage is that, by use of chip technology, manufacture thereof has been simplified considerably.

At least one of the recesses 6, 7 may also be designed as an elongated slot with a width direction and a longitudinal direction. Here, the longitudinal direction preferably extends approximately transverse to the or a rotational axis of the holder, in particular the rotational axis for tilt of the microreactor, so that, with relatively large tilt angles, the electron beam is prevented from being obstructed by the material around the recess 6, 7, also if the recesses, at least the exposed parts of the cover layers, are not completely aligned with respect to one another.

As the case may be, the windows may be somewhat or completely permeable to gas, particularly if the gases used are not damaging to the microscope. As a result of the particularly small surfaces of the windows, the pressure can then still be controlled sufficiently.

The invention is by no means limited to the embodiments given in the introduction and the description. Many variations thereof are possible within the framework of the invention. Thus, the materials and dimensions are only mentioned by way of illustration and should not be taken as being limitative. Particularly combinations of parts of the embodiments shown and described are also to be understood as being embodied and described herein. In particular, the first and second chips 2, 3 can be used individually as a microreactor, at least as a hot plate designed as such.

These and many similar variations are understood to be within the framework of the invention as set forth in the claims.

What is claimed is:

1. A microreactor for use in a microscope, the microreactor comprising:
    a sandwich structure comprising:
        a first chip comprising a central first layer of semiconductor material, the first layer being provided with a central recess;
        a spacer; and
        a second chip comprising a second layer of semiconductor material, the second layer being provided with a central recess, wherein the first chip, the spacer and the second chip are assembled together forming the sandwich structure such the spacer is sandwiched between the first and second chips and such that the central recess of the first chip and the central recess of the second chip are opposite each other, and wherein the first chip comprises a first cover layer extending into the central recess of the first layer, at a side facing the second chip in the sandwich structure, and wherein the second chip comprises a second cover layer extending into the central recess of the second layer, at a side facing the first chip in the sandwich structure, wherein the first cover layer and the second cover layer extend next to each other at a mutual distance from each other;
    a chamber enclosed between the first cover layer, the second cover layer and the spacer, the chamber having an inlet and an outlet for feeding fluid through the chamber;
    a first window in the first cover layer that is transparent to an electron beam of an electron microscope;
    a second window in the second cover layer that is transparent to an electron beam of an electron microscope, the second window being located opposite the first window in the first cover layer; and
    a heating element in at least one of the first cover layer and the second cover layer located centrally with respect to the corresponding central recess.

2. The microreactor according to claim 1, wherein said chamber has an exposed surface, measured approximately parallel to said first and second windows, which is less than 20 mm$^2$.

3. The microreactor according to claim 1, wherein said first and second cover layers are gastight and liquid-tight.

4. The microreactor according to claim 1, wherein the first and second windows are formed as recesses in the first and second cover layers respectively.

5. The microreactor according to claim 1, wherein the heating element comprises a heater coil.

6. The microreactor according to claim 5, wherein the heating element is provided such that it operatively ensures an even heat distribution in the chamber.

7. The microreactor according to claim 1, wherein the heating element comprises more than one spaced apart heating parts.

8. The microreactor according to claim 1, wherein each of the first and second cover layers is part of a first and second body, which first and second bodies are mutually connected for formation of the microreactor.

9. The microreactor according to claim 1, wherein at least one of the first chip and the second chip comprises a central first layer.

10. The microreactor according to claim 9, wherein at least one of the first chip and the second chip comprises an uninterrupted intermediate layer facing one of the first cover layer and the second cover layer and forming a single or a multiple number of windows.

11. The microreactor according to claim 10, wherein the first window is formed by a recess in the first cover layer and wherein the second window is formed by a recess in the second cover layer.

12. The microreactor according to claim 1, wherein the first cover layer comprises two layers and wherein the heating element is provided between said two layers of the first cover layer.

* * * * *